United States Patent
Naka

(10) Patent No.: US 9,246,065 B2
(45) Date of Patent: Jan. 26, 2016

(54) SEMICONDUCTOR LIGHT EMITTING DEVICE AND METHOD FOR MANUFACTURING SEMICONDUCTOR LIGHT EMITTING DEVICE

(71) Applicant: KABUSHIKI KAISHA TOSHIBA, Minato-ku (JP)

(72) Inventor: Tomomichi Naka, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/491,719

(22) Filed: Sep. 19, 2014

(65) Prior Publication Data

US 2015/0044793 A1 Feb. 12, 2015

Related U.S. Application Data

(62) Division of application No. 13/153,886, filed on Jun. 6, 2011, now abandoned.

(30) Foreign Application Priority Data

Jun. 7, 2010 (JP) ................................. 2010-130332

(51) Int. Cl.
*H01L 33/50* (2010.01)
*H01L 33/54* (2010.01)
(Continued)

(52) U.S. Cl.
CPC ............ *H01L 33/502* (2013.01); *H01L 33/505* (2013.01); *H01L 33/507* (2013.01); *H01L 33/508* (2013.01); *H01L 33/54* (2013.01); *H01L 33/44* (2013.01); *H01L 33/501* (2013.01);
(Continued)

(58) Field of Classification Search
CPC combination set(s) only.
See application file for complete search history.

(56) References Cited

U.S. PATENT DOCUMENTS 7,845,771 B2 12/2010 Koizumi
2005/0146879 A1* 7/2005 Takahashi et al. ............ 362/296
(Continued)

FOREIGN PATENT DOCUMENTS

JP       10-190065 A    7/1998
JP     2000-156528 A    6/2000
(Continued)

OTHER PUBLICATIONS

Office Action issued Aug. 13, 2012 in Japanese Patent Application No. 2010-130332 (with English-language translation).
(Continued)

*Primary Examiner* — Matthew W Such
*Assistant Examiner* — Abul Kalam
(74) *Attorney, Agent, or Firm* — Oblon, McClelland, Maier & Neustadt, L.L.P.

(57) ABSTRACT

According to one embodiment, a semiconductor light emitting device includes a light emitting section, a light transmitting section, a wavelength conversion section, a first conductive section, a second conductive section and a sealing section. The light emitting section includes a first major surface, a second major surface opposite from the first major surface, and a first electrode section and a second electrode section formed on the second major surface. The light transmitting section is provided on a side of the first major surface. The wavelength conversion section is provided over the light transmitting section. The wavelength conversion section is formed from a resin mixed with a phosphor, and hardness of the cured resin is set to exceed 10 in Shore D hardness.

8 Claims, 5 Drawing Sheets

(51) Int. Cl.
  *H01L 33/44* (2010.01)
  *H01L 33/52* (2010.01)
  *H01L 33/62* (2010.01)

(52) U.S. Cl.
  CPC ............ *H01L33/52* (2013.01); *H01L 33/62* (2013.01); *H01L 2224/16* (2013.01); *H01L 2933/005* (2013.01); *H01L 2933/0041* (2013.01)

(56) References Cited

U.S. PATENT DOCUMENTS

| | | |
|---|---|---|
| 2008/0173884 A1 | 7/2008 | Chitnis et al. |
| 2009/0039369 A1 | 2/2009 | Niino et al. |
| 2010/0112734 A1 | 5/2010 | Koizumi et al. |
| 2011/0279017 A1* | 11/2011 | Li et al. ............ 313/503 |

FOREIGN PATENT DOCUMENTS

| | | |
|---|---|---|
| JP | 2002-64112 A | 2/2002 |
| JP | 2002-118293 A | 4/2002 |
| JP | 2004-140220 A | 5/2004 |
| JP | 2006-41479 A | 2/2006 |
| JP | 2006-303154 A | 11/2006 |
| JP | 2007-519233 A | 7/2007 |
| JP | 2007-273562 A | 10/2007 |
| JP | 2007-332259 A | 12/2007 |
| JP | 2008-6418 | 1/2008 |
| JP | 2008-166782 | 7/2008 |
| JP | 2010-114218 | 5/2010 |
| JP | 2010-517289 A | 5/2010 |
| JP | 2010-517290 A | 5/2010 |
| JP | 2010-135693 | 6/2010 |
| JP | 2010-135763 | 6/2010 |
| JP | 2010-141176 | 6/2010 |
| JP | 2012-507847 A | 3/2012 |
| WO | WO 02/059982 A1 | 8/2002 |
| WO | WO 2010/052621 A1 | 5/2010 |

OTHER PUBLICATIONS

Japanese Office Action issued Mar. 22, 2013 in Patent Application No. 2010-130332 with English Translation.

Office Action issued May 30, 2013 in Japanese Patent Application No. 2010-130332 with English language translation.

* cited by examiner

SEMICONDUCTOR LIGHT EMITTING DEVICE AND METHOD FOR MANUFACTURING SEMICONDUCTOR LIGHT EMITTING DEVICE

CROSS-REFERENCE TO RELATED APPLICATIONS

This application is a divisional of and claims the benefit of priority under 35 U.S.C. §120 from U.S. Ser. No. 13/153,886, filed Jun. 6, 2011, and claims the benefit of priority under 35 U.S.C. §119 from Japanese Patent Application No. 2010-130332, filed on Jun. 7, 2010; the entire contents of which are incorporated herein by reference.

FIELD

Embodiments described herein relate generally to a semiconductor light emitting device and a method for manufacturing the same.

BACKGROUND

Semiconductor light emitting devices emitting high brightness blue light based on Group III nitride semiconductors such as gallium nitride (GaN) are known. According to already proposed techniques, a semiconductor light emitting device emitting blue light can be used to emit white light by combination with a wavelength conversion section including phosphor having wavelength conversion capability. Here, productivity can be improved by integrally forming a plurality of semiconductor light emitting devices and then singulating each semiconductor light emitting device. However, in the case where a wavelength conversion section including phosphor is provided, the phosphor may be detached from the wavelength conversion section when each semiconductor light emitting device is singulated.

DETAILED DESCRIPTION

Figure 1:
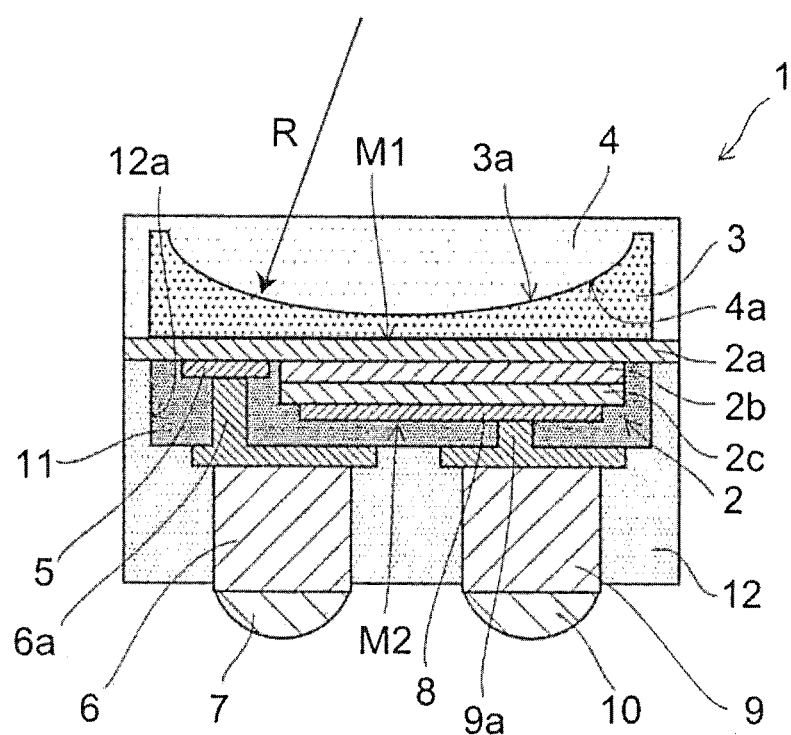
FIG. 1 is a schematic sectional view illustrating a semiconductor light emitting device according to an embodiment.

In general, according to one embodiment, a semiconductor light emitting device includes a light emitting section, a light transmitting section, a wavelength conversion section, a first conductive section, a second conductive section and a sealing section. The light emitting section includes a first major surface, a second major surface opposite from the first major surface, and a first electrode section and a second electrode section formed on the second major surface. The light transmitting section is provided on a side of the first major surface. The wavelength conversion section is provided over the light transmitting section. The first conductive section is provided on the first electrode section. The second conductive section is provided on the second electrode section. The sealing section is provided on a side of the second major surface and seals the first conductive section and the second conductive section while exposing an end portion of the first conductive section and an end portion of the second conductive section. The wavelength conversion section is formed from a resin mixed with a phosphor, and hardness of the cured resin is set to exceed 10 in Shore D hardness.

In general, according to another embodiment, a method is disclosed for manufacturing a semiconductor light emitting device. The device includes a light emitting section and a wavelength conversion section. The light emitting section includes a first major surface, a second major surface opposite from the first major surface, and a first electrode section and a second electrode section formed on the second major surface. The wavelength conversion section is provided on a side of the first major surface and formed from a resin mixed with a phosphor. The method includes setting hardness of the cured resin to exceed 10 in Shore D hardness.

Various embodiments will be illustrated hereinafter with reference to the accompanying drawings. In the figures, similar components are labeled with like reference numerals, and the detailed description thereof is omitted as appropriate.

FIG. 1 is a schematic sectional view illustrating a semiconductor light emitting device according to an embodiment.

As shown in FIG. 1, the semiconductor light emitting device 1 includes a light emitting section 2, a light transmitting section 3, a wavelength conversion section 4, a first conductive section 6, a first connecting member 7, a second conductive section 9, a second connecting member 10, an insulating section 11, and a sealing section 12.

The light emitting section 2 includes a first major surface M1 and a second major surface M2 opposite from the first major surface M1. The light emitting section 2 further includes a first electrode section 5 and a second electrode section 8 formed on the second major surface M2.

The light emitting section 2 includes a semiconductor section 2a, an active section 2b, and a semiconductor section 2c.

The semiconductor section 2a can be made of a semiconductor doped into n-type (n-type semiconductor). In this case, the semiconductor section 2a can be made of an n-type nitride semiconductor. Examples of the nitride semiconductor can include GaN (gallium nitride), AlN (aluminum nitride), AlGaN (aluminum gallium nitride), and InGaN (indium gallium nitride).

The active section 2b is provided between the semiconductor section 2a and the semiconductor section 2c.

The active section 2b can be configured as a quantum well structure composed of a well layer and a barrier layer (cladding layer). In the well layer, holes and electrons are recombined to generate light. The barrier layer has a larger band gap than the well layer.

In this case, the quantum well structure may be a single quantum well (SQW) structure or a multiple quantum well (MQW) structure. Alternatively, a plurality of single quantum well structures may be stacked.

For instance, in an example of the single quantum well structure, a barrier layer made of GaN (gallium nitride), a well layer made of InGaN (indium gallium nitride), and a barrier layer made of GaN (gallium nitride) can be stacked in this order.

In an example of the multiple quantum well structure, a barrier layer made of GaN (gallium nitride), a well layer made of InGaN (indium gallium nitride), a barrier layer made of GaN (gallium nitride), a well layer made of InGaN (indium gallium nitride), and a barrier layer made of GaN (gallium nitride) can be stacked in this order.

In this case, the aforementioned semiconductor section 2a can be used as a barrier layer.

The active section 2b is not limited to quantum well structures, but can be appropriately selected from structures capable of emitting light.

The semiconductor section 2c can be made of a semiconductor doped into p-type (p-type semiconductor). In this case, the semiconductor section 2c can be made of a p-type nitride semiconductor. Examples of the nitride semiconductor can include GaN (gallium nitride), AlN (aluminum nitride), AlGaN (aluminum gallium nitride), and InGaN (indium gallium nitride).

The light emitting section 2 can be e.g. a light emitting diode having a peak emission wavelength of 380-530 nm. Alternatively, the light emitting section 2 can be e.g. a light emitting diode having an emission wavelength band of 350-600 nm.

The light transmitting section 3 is formed on the first major surface M1 of the light emitting section 2.

The light transmitting section 3 transmits light emitted from the light emitting section 2 and suppresses chromaticity shift.

To facilitate transmission of light emitted from the light emitting section 2, the transmittance of the light transmitting section 3 can be set to e.g. 90% or more in the wavelength region of 420-720 nm. The refractive index of the light transmitting section 3 can be set to 1.2 or more and 1.9 or less.

The light transmitting section 3 is provided to suppress chromaticity shift in which the chromaticity varies with the direction of viewing the semiconductor light emitting device 1. That is, the light transmitting section 3 is provided so that the optical path length inside the wavelength conversion section 4 is adjusted to suppress chromaticity shift in accordance with the emission characteristic of the light emitting section 2. The suppression of chromaticity shift will be described later in detail.

Examples of the material forming the light transmitting section 3 can include epoxy resin, silicone resin, methacrylic resin (PMMA), polycarbonate (PC), cyclic polyolefin (COP), alicyclic acrylate (OZ), allyldiglycol carbonate (ADC), acrylic resin, fluororesin, hybrid resin of silicone resin and epoxy resin, urethane resin, $SiO_2$, and $TiO_2$.

Here, in the case where light emitted from the light emitting section 2 has a short wavelength from ultraviolet to blue and high brightness, the material forming the light transmitting section 3 may be degraded. Thus, the material forming the light transmitting section 3 is preferably made less prone to degradation by blue light. Examples of resins less prone to degradation by blue light can include methylphenyl silicone and dimethyl silicone having a refractive index of approximately 1.5.

However, the material is not limited to those illustrated above, but can be appropriately modified. Here, the diameter dimension of the opening portion of the concave surface 3a provided in the light transmitting section 3 (so to speak, the dimension of the wavelength conversion section 4) is preferably made larger than the dimension of the light emitting section 2.

The wavelength conversion section 4 is provided on the first major surface M1 side of the light emitting section 2 and includes phosphor described later. The wavelength conversion section 4 is provided over the light transmitting section 3.

The wavelength conversion section 4 can be formed from a resin mixed with phosphor having wavelength conversion capability.

The phosphor can be e.g. particulate, with a particle diameter of 10 μm or less.

The wavelength conversion section 4 can include at least one or more of phosphors having a peak emission wavelength of 440 nm or more and 470 nm or less (blue), 500 nm or more and 555 nm or less (green), 560 nm or more and 580 nm or less (yellow), and 600 nm or more and 670 nm or less (red). Furthermore, the wavelength conversion section 4 can include a phosphor having an emission wavelength band of 380-720 nm.

The phosphor can include at least one element selected from the group consisting of silicon (Si), aluminum (Al), titanium (Ti), germanium (Ge), phosphorus (P), boron (B), yttrium (Y), alkaline earth element, sulfide element, rare earth element, and nitride element.

Examples of the material of the phosphor emitting red fluorescence include the following. However, the phosphor emitting red fluorescence used in the embodiments is not limited thereto.

$Y_2O_2S$:Eu,
$Y_2O_2S$:Eu+pigment,
$Y_2O_3$:Eu,
$Zn_3(PO_4)_2$:Mn,
(Zn,Cd)S:Ag+$In_2O_3$,
(Y,Gd,Eu)$BO_3$,
(Y,Gd,Eu)$_2O_3$,
$YVO_4$:Eu,
$La_2O_2S$:Eu,Sm,
$LaSi_3N_5$:$Eu^{2+}$,
α-sialon:$Eu^{2+}$,
$CaAlSiN_3$:$Eu^{2+}$,
$CaSiN_x$:$Eu^{2+}$,
$CaSiN_x$:$Ce^{2+}$,
$M_2Si_5N_8$:$Eu^{2+}$,
(SrCa)$AlSiN_3$:$Eu^{X+}$,
$Sr_x(Si_yAl_3)_z(O_xN)$:$Eu^{X+}$ Examples of the material of the phosphor emitting green fluorescence include the following. However, the phosphor emitting green fluorescence used in the embodiments is not limited thereto.

ZnS:Cu,Al,
ZnS:Cu,Al+pigment,
(Zn,Cd)S:Cu,Al,
ZnS:Cu,Au,Al+pigment,
$Y_3Al_5O_{12}$:Tb,
$Y_3(Al,Ga)_5O_{12}$:Tb,
$Y_2SiO_5$:Tb,
$Zn_2SiO_4$:Mn,
(Zn,Cd)S:Cu,
ZnS:Cu,
ZnS:Cu+$Zn_2SiO_4$:Mn,
$Gd_2O_2S$:Tb,
(Zn,Cd)S:Ag,
$Y_2O_2S$:Tb,
ZnS:Cu,Al+$In_2O_3$,
(Zn,Cd)S:Ag+$In_2O_3$,
$(Zn,Mn)_2SiO_4$,
$BaAl_{12}O_{19}$:Mn,
(Ba,Sr,Mg)O.$aAl_2O_3$:Mn,
$LaPO_4$:Ce,Tb,
3(Ba,Mg,Eu,Mn)O.$8Al_2O_3$,
$La_2O_3.0.2SiO_2.0.9P_2O_5$:Ce,Tb,
$CeMgAl_{11}O_{19}$:Tb,
$CeSc_2O_4$:Ce,
(BrSr)$SiO_4$:Eu,
α-sialon:$Yb^{2+}$,
β-sialon:$Eu^{2+}$, (SrBa)YSi$_4$N$_7$:Eu$^{2+}$,
(CaSr)Si$_2$O$_4$N$_7$:Eu$^{2+}$,
Sr(SiAl)(ON):Ce Examples of the material of the phosphor emitting blue fluorescence include the following. However, the phosphor emitting blue fluorescence used in the embodiments is not limited thereto.

ZnS:Ag,
ZnS:Ag+pigment,
ZnS:Ag,Al,
ZnS:Ag,Cu,Ga,Cl,
ZnS:Ag+In$_2$O$_3$,
ZnS:Zn+In$_2$O$_3$,
(Ba,Eu)MgAl$_{10}$O$_{17}$,
(Sr,Ca,Ba,Mg)$_{10}$(PO$_4$)6Cl$_2$:Eu,
Sr$_{10}$(PO$_4$)6Cl$_2$:Eu,
(Ba,Sr,Eu)(Mg,Mn)Al$_{10}$O$_{17}$,
10(Sr,Ca,Ba,Eu).6PO$_4$.Cl$_2$,
BaMg$_2$Al$_{16}$O$_{25}$:Eu Examples of the material of the phosphor emitting yellow fluorescence include the following. However, the phosphor emitting yellow fluorescence used in the embodiments is not limited thereto.

Li(Eu,Sm)W$_2$O$_8$,
(Y,Gd)$_3$(Al,Ga)$_5$O$_{12}$:Ce$^{3+}$,
Li$_2$SrSiO$_4$:Eu$^{2+}$,
(Sr(Ca,Ba))$_3$SiO$_5$:Eu$^{2+}$,
SrSi$_2$ON$_{2.7}$:Eu$^{2+}$

Examples of the material of the phosphor emitting yellow-green fluorescence include the following. However, the phosphor emitting yellow-green fluorescence used in the embodiments is not limited thereto.

SrSi$_2$ON$_{2.7}$:Eu$^{2+}$

If the mixing ratio of the phosphor is made lower, the color gets close to blue (color temperature around 10000 K). If the mixing ratio of the phosphor is made higher, the color gets close to yellow (color temperature 6500-2800 K). Here, the phosphor mixed is not limited to one kind, but a plurality of kinds of phosphors may be mixed. For instance, it is possible to mix a phosphor emitting red fluorescence, a phosphor emitting green fluorescence, a phosphor emitting blue fluorescence, a phosphor emitting yellow fluorescence, and a phosphor emitting yellow-green fluorescence. Furthermore, the mixing ratio of a plurality of kinds of phosphors can be varied to change the tint, such as bluish white light and yellowish white light.

Examples of the resin mixed with phosphor can include epoxy resin, silicone resin, methacrylic resin (PMMA), polycarbonate (PC), cyclic polyolefin (COP), alicyclic acrylate (OZ), allyldiglycol carbonate (ADC), acrylic resin, fluororesin, hybrid resin of silicone resin and epoxy resin, and urethane resin.

The refractive index of the resin mixed with phosphor is preferably made equal to or less than the refractive index of the phosphor. The transmittance of the resin mixed with phosphor is preferably set to 90% or more.

Here, in the case where light emitted from the light emitting section 2 has a short wavelength from ultraviolet to blue and high brightness, the resin forming the wavelength conversion section 4 may be degraded. Thus, the resin forming the wavelength conversion section 4 is preferably made less prone to degradation by blue light. Examples of resins less prone to degradation by blue light can include methylphenyl silicone, dimethyl silicone, and hybrid resin of methylphenyl silicone and epoxy resin having a refractive index of approximately 1.5.

However, the resin mixed with phosphor is not limited to those illustrated above, but can be appropriately modified.

In the embodiment, in order to suppress detachment of phosphor from the wavelength conversion section 4, the hardness of the cured resin portion of the wavelength conversion section 4 is set to within a prescribed range. For instance, the Shore D hardness measured with a durometer type D (Shore D) pursuant to JIS K 6253 is set to exceed 10.

In this case, the Shore D hardness of the cured resin portion of the wavelength conversion section 4 can be controlled by, e.g., adding an additive such as curing agent.

If cross-linking sites of the resin can be increased by adding an additive such as curing agent, the Shore D hardness of the cured resin portion of the wavelength conversion section 4 can be increased. Thus, the Shore D hardness of the cured resin portion of the wavelength conversion section 4 can be controlled by appropriately changing the kind of the additive such as curing agent and its added amount.

The suppression of detachment of phosphor will be described later in detail.

The first electrode section 5 is provided on the semiconductor section 2a and can be made of e.g. a double layer of Ni (nickel)/Au (gold). In this case, for instance, the thickness of the Ni (nickel) layer can be set to approximately 1 μm, and the thickness of the Au (gold) layer can be set to approximately 1 μm. However, the material and thickness of the first electrode section 5 are not limited to those illustrated above, but may be appropriately modified. The shape of the first electrode section 5 can be e.g. a circular shape. However, the shape of the first electrode section 5 is not limited to a circular shape, but may be appropriately modified depending on the cross-sectional shape and size of the first connecting section 6a described later.

The first conductive section 6 is provided so as to penetrate between the bottom surface of the recess 12a and the end surface of the sealing section 12. The first conductive section 6 is shaped like e.g. a circular cylinder, and can be made of a metal material such as Cu (copper). The first conductive section 6 is provided with a first connecting section 6a having a small cross-sectional area. The first connecting section 6a is provided on the first electrode section 5. Thus, the first conductive section 6 is electrically connected to the semiconductor section 2a through the first electrode section 5. However, the shape and material of the first conductive section 6 and the first connecting section 6a are not limited to those illustrated above, but can be appropriately modified.

The first connecting member 7 is provided over one end surface of the first conductive section 6 exposed from the sealing section 12. The first connecting member 7 can be configured as a so-called solder bump. In the case where the first connecting member 7 is configured as a solder bump, the first connecting member 7 can be shaped like a hemisphere, and its material can be a solder material used for surface mounting. In this case, the solder material used for surface mounting can be e.g. Sn-3.0Ag-0.5Cu solder, Sn-0.8Cu solder, or Sn-3.5Ag solder.

However, the shape and material of the first connecting member 7 are not limited to those illustrated above, but can be appropriately modified depending on the method for mounting the semiconductor light emitting device 1. For instance, the first connecting member 7 can be shaped like a thin film, and made of e.g. a double layer of Ni (nickel)/Au (gold).

Furthermore, the first connecting member 7 is not necessarily needed, but may be appropriately provided depending on the method for mounting the semiconductor light emitting device 1.

The second electrode section 8 is provided on the semiconductor section 2c and can be made of e.g. a double layer of Ni (nickel)/Au (gold). In this case, for instance, the thickness of the Ni (nickel) layer can be set to approximately 1 µm, and the thickness of the Au (gold) layer can be set to approximately 1 µm. However, the material and thickness of the second electrode section 8 are not limited to those illustrated above, but may be appropriately modified. The shape of the second electrode section 8 can be e.g. a circular shape. However, the shape of the second electrode section 8 is not limited to a circular shape, but may be appropriately modified depending on the cross-sectional shape and size of the second connecting section 9a described later.

The second conductive section 9 is provided so as to penetrate between the bottom surface of the recess 12a and the end surface of the sealing section 12. The second conductive section 9 is shaped like e.g. a circular cylinder, and can be made of a metal material such as Cu (copper). The second conductive section 9 is provided with a second connecting section 9a having a small cross-sectional area. The second connecting section 9a is provided on the second electrode section 8. Thus, the second conductive section 9 is electrically connected to the semiconductor section 2c through the second electrode section 8. However, the shape and material of the second conductive section 9 and the second connecting section 9a are not limited to those illustrated above, but can be appropriately modified.

The second connecting member 10 is provided over one end surface of the second conductive section 9 exposed from the sealing section 12. The second connecting member 10 can be configured as a so-called solder bump. In the case where the second connecting member 10 is configured as a solder bump, the second connecting member 10 can be shaped like a hemisphere, and its material can be a solder material used for surface mounting. In this case, the solder material used for surface mounting can be e.g. Sn-3.0Ag-0.5Cu solder, Sn-0.8Cu solder, or Sn-3.5Ag solder.

However, the shape and material of the second connecting member 10 are not limited to those illustrated above, but can be appropriately modified depending on the method for mounting the semiconductor light emitting device 1. For instance, the second connecting member 10 can be shaped like a thin film, and made of e.g. a double layer of Ni (nickel)/Au (gold).

Furthermore, the second connecting member 10 is not necessarily needed, but may be appropriately provided depending on the method for mounting the semiconductor light emitting device 1.

The insulating section 11 is provided so as to bury the recess 12a provided in the sealing section 12. The insulating section 11 is formed from an insulating material. For instance, the insulating section 11 can be formed from an inorganic material such as $SiO_2$, or a resin.

Here, in the case where light emitted from the light emitting section 2 has a short wavelength from ultraviolet to blue and high brightness, the resin forming the insulating section 11 may be degraded. Thus, in the case where the insulating section 11 is formed from a resin, the resin is preferably made less prone to degradation by blue light. Examples of resins less prone to degradation by blue light can include methylphenyl silicone and dimethyl silicone having a refractive index of approximately 1.5.

The sealing section 12 is provided on the second major surface M2 side. The sealing section 12 seals the first conductive section 6 and the second conductive section 9 while exposing the end portion of the first conductive section 6 and the end portion of the second conductive section 9.

The sealing section 12 can be formed from e.g. a thermosetting resin. The sealing section 12 also serves to seal the light emitting section 2, the first electrode section 5, and the second electrode section 8. Here, the sealing section 12 can be formed integrally with the insulating section 11.

Next, suppression of chromaticity shift is further illustrated.

Figure 2:
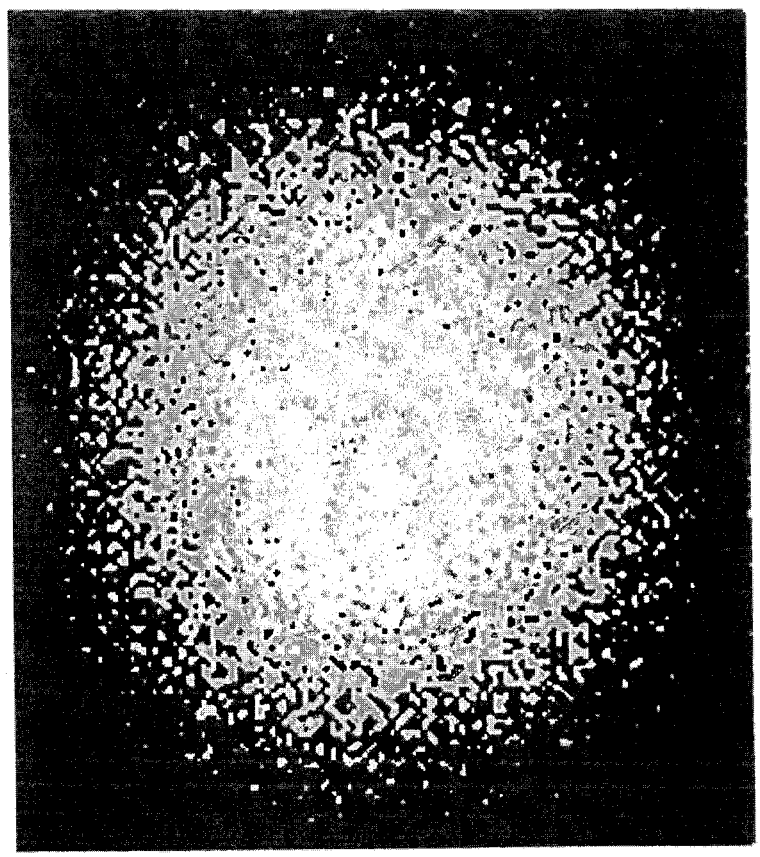
FIG. 2 is a schematic view for illustrating the emission characteristic of the light emitting section.

FIG. 2 is a schematic view for illustrating the emission characteristic of the light emitting section 2. The emission characteristic is shown by monotone shading, getting darker toward blue and lighter toward yellow.

In the case illustrated in FIG. 2, the color is yellow in the central portion of the light emitting section 2 and gets blue toward the periphery.

Such variation in the emission characteristic of the light emitting section 2 may result in increasing the chromaticity shift in which the chromaticity varies with the direction of viewing the semiconductor light emitting device 1.

According to the findings obtained by the inventor, the chromaticity shift can be suppressed by changing the optical path length inside the wavelength conversion section in accordance with the emission characteristic of the light emitting section.

The following description is illustrated with reference to the case where the emission characteristic of the light emitting section 2 is as illustrated in FIG. 2. That is, the following description is illustrated with reference to the case where the color is yellow in the central portion of the light emitting section 2 and gets blue toward the periphery. Examples of the light emitting section 2 having such emission characteristic can include those made of e.g. a nitride semiconductor such as GaN (gallium nitride).

Figure 3:
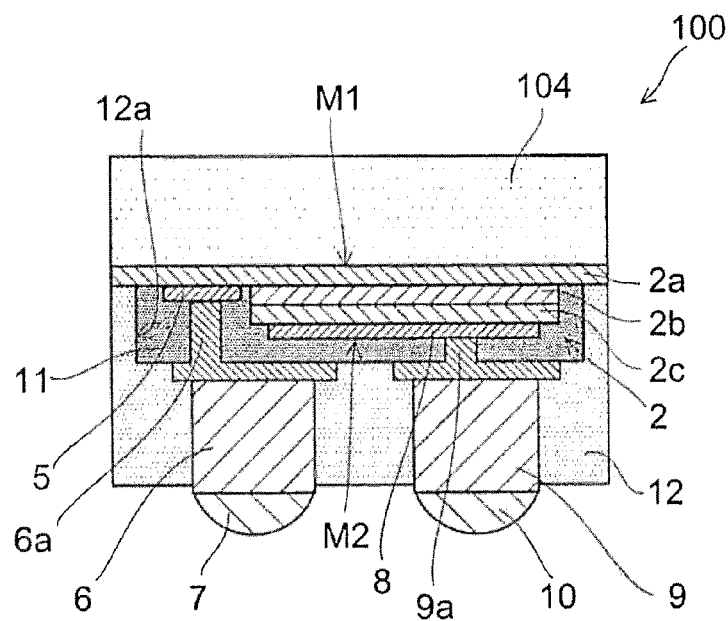
FIG. 3 is a schematic sectional view illustrating a semiconductor light emitting device according to a comparative example.

FIG. 3 is a schematic sectional view illustrating a semiconductor light emitting device 100 according to a comparative example.

As shown in FIG. 3, the semiconductor light emitting device 100 includes a light emitting section 2, a wavelength conversion section 104, a first electrode section 5, a first conductive section 6, a first connecting member 7, a second electrode section 8, a second conductive section 9, a second connecting member 10, an insulating section 11, and a sealing section 12. That is, the semiconductor light emitting device 100 does not include the light transmitting section 3.

Figure 4:
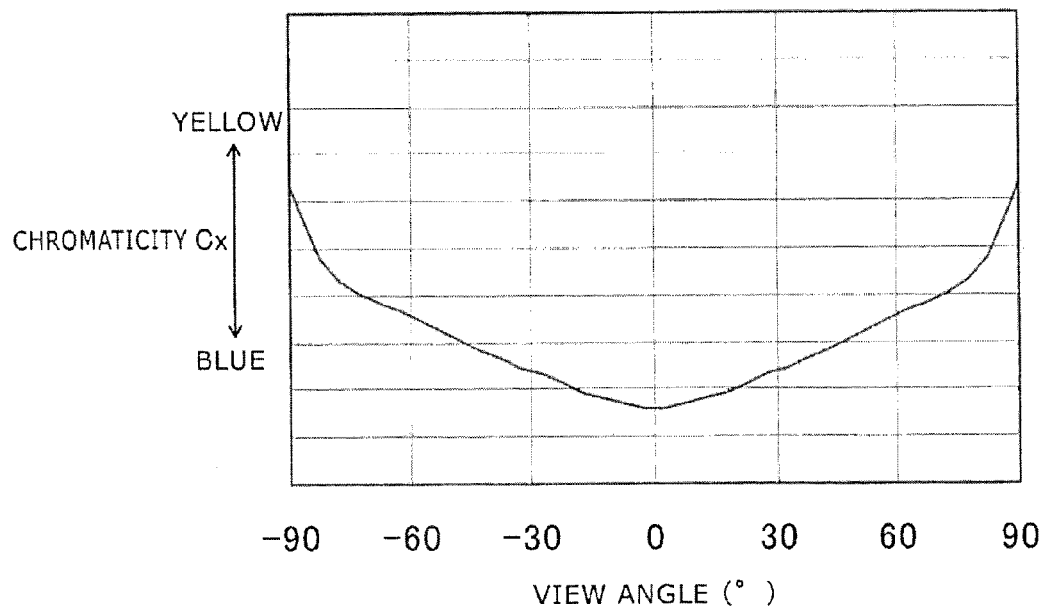
FIG. 4 is a schematic graph for illustrating the chromaticity shift.

FIG. 4 is a schematic graph for illustrating the chromaticity shift.

Here, FIG. 4 is obtained by simulation analysis of light emitted from a prescribed position and transmitted through the wavelength conversion section. The horizontal axis of FIG. 4 represents view angle, with 0° corresponding to the case of viewing the semiconductor light emitting device from its front side, and 90° and −90° corresponding to the case of viewing the semiconductor light emitting device from its lateral side. The vertical axis of FIG. 4 represents chromaticity, getting yellow upward and blue downward in the graph. The chromaticity shift is represented by the chromaticity difference with respect to the view angle. Thus, for instance, the chromaticity shift is smaller as the difference between the chromaticity at 0° and the chromaticity at 90° or −90° gets smaller.

As seen from FIG. 4, in the plate-like wavelength conversion section 104 without the light transmitting section 3, the chromaticity shift is large.

According to the findings obtained by the inventor, the chromaticity shift can be suppressed by a wavelength conversion section having a shape in which the optical path length inside the wavelength conversion section is adjusted to suppress the chromaticity shift in accordance with the emission characteristic of the light emitting section. That is, the chromaticity shift can be suppressed by optimizing the optical path length inside the wavelength conversion section in accordance with the emission characteristic of the light emitting section.

Thus, in the embodiment, by providing a light transmitting section, the wavelength conversion section is shaped so as to be able to suppress the chromaticity shift. For instance, in the case illustrated in FIG. 1, a light transmitting section 3 having a concave surface 3a is provided to form a convex surface 4a in the wavelength conversion section 4. Thus, the optical path length inside the wavelength conversion section 4 is optimized in accordance with the emission characteristic of the light emitting section 2. In this case, the suppression of chromaticity shift can be controlled by changing the curvature radius R of the surface 4a.

Here, the shape of the wavelength conversion section formed by providing a light transmitting section is not limited to those having a convex shape. For instance, a light transmitting section having a convex shape can be provided to form a wavelength conversion section having a concave shape. Alternatively, a light transmitting section with a flat surface around a convex shape can be provided to form a wavelength conversion section with a flat surface around a concave shape. Furthermore, a convex shape, a concave shape, and a flat surface may be appropriately combined. Furthermore, the curvature radius may be appropriately changed. That is, the shape of the wavelength conversion section only needs to be formed so that the optical path length inside the wavelength conversion section is optimized in accordance with the emission characteristic of the light emitting section 2.

In the case of changing the curvature radius, the curvature radius of the convex shape is preferably set to 250 nm or more. Furthermore, the curvature radius of the concave shape is preferably set to 200 nm or more.

The chromaticity shift can be further suppressed by changing the kinds of phosphors and the distribution of their ratio in the plane of the wavelength conversion section. For instance, in the case where the color gets blue toward the periphery of the light emitting section 2 as illustrated in FIG. 2, the ratio of the phosphor emitting yellow fluorescence can be increased toward the periphery of the wavelength conversion section. Then, white light can be emitted in nearly the entire region of the wavelength conversion section.

Next, the suppression of detachment of phosphor is further illustrated.

Productivity can be improved by integrally forming a plurality of semiconductor light emitting devices 1 and then singulating each semiconductor light emitting device 1. However, in the case where a wavelength conversion section 4 including phosphor is provided, the phosphor may be detached from the wavelength conversion section 4 when each semiconductor light emitting device 1 is singulated.

According to the findings obtained by the inventor, detachment of phosphor from the wavelength conversion section in singulating the semiconductor light emitting device can be suppressed by setting the hardness of the cured resin portion of the wavelength conversion section to within a prescribed range.

TABLE 1 illustrates the relationship between the hardness of the cured resin portion of the wavelength conversion section and the detachment of phosphor.

FIGS. 5A to 5D are schematic views for illustrating the detachment of phosphor.

Here, FIGS. 5A to 5D illustrate the cutting surface of the semiconductor light emitting device singulated by the blade dicing method. The number of revolutions of the dicing blade was set to 40000 rpm.

TABLE 1

| | Sample | | | |
|---|---|---|---|---|
| | 1 | 2 | 3 | 4 |
| Resin | Dimethyl silicone | Epoxy + phenyl silicone | Dimethyl silicone | Phenyl silicone |
| Viscosity (mPa·s) | 340 | 1470 | 3000 | 2200 |
| Refractive index | 1.41 | 1.48 | 1.53 | 1.54 |
| Hardness | A34(≤D10) | D74 | A87(D30) | D60~D70 |
| Detachment of phosphor | Observed (see FIG. 5A) | None (see FIG. 5B) | None (see FIG. 5C) | None (see FIG. 5D) |

In Sample #1 of TABLE 1, the hardness of the cured resin portion of the wavelength conversion section is 34 in the Shore A hardness (10 or less in the Shore D hardness).

Figure 5A:
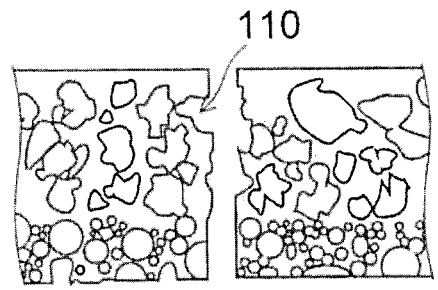
FIGS. 5A to 5D are schematic views for illustrating the detachment of phosphor.

In such cases, as seen from FIG. 5A, a recess 110 occurs in the cutting surface, and the phosphor is detached.

In Sample #2, the hardness of the cured resin portion of the wavelength conversion section is 74 in the Shore D hardness.

In Sample #3, the hardness of the cured resin portion of the wavelength conversion section is 87 in the Shore A hardness (30 in the Shore D hardness).

In Sample #4, the hardness of the cured resin portion of the wavelength conversion section is 60-70 in the Shore D hardness.

That is, in Samples #2-4, the hardness of the cured resin portion of the wavelength conversion section exceeds 10 in the Shore D hardness.

Figure 5B:
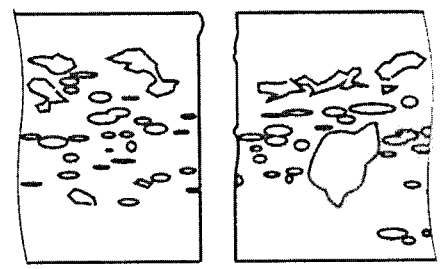
Figure 5C:
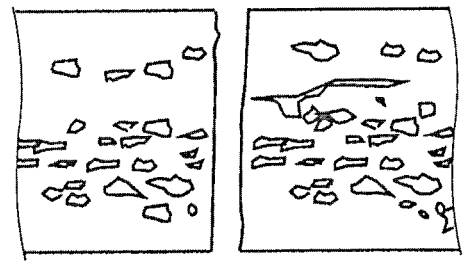
Figure 5D:
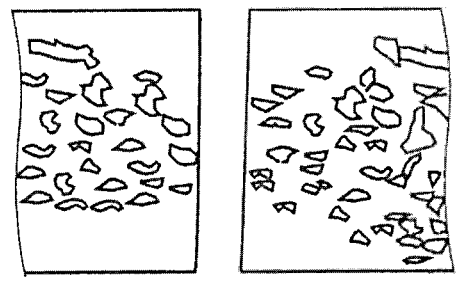

In such cases, as seen from FIGS. 5B to 5D, no recess 110 occurs in the cutting surface, and the detachment of phosphor can be suppressed.

That is, if the hardness of the cured resin portion of the wavelength conversion section is set to exceed 10 in the Shore D hardness, the detachment of phosphor can be suppressed.

Furthermore, if the hardness of the cured resin portion of the wavelength conversion section is set to 30 or more in the Shore D hardness, the detachment of phosphor can be further suppressed.

Next, the operation of the semiconductor light emitting device 1 is illustrated.

By voltage application to the first conductive section 6, a potential is applied to the semiconductor section 2a through the first electrode section 5. By voltage application to the second conductive section 9, a potential is applied to the semiconductor section 2c through the second electrode section 8. When potentials are thus applied to the semiconductor section 2a and the semiconductor section 2c, holes and electrons are recombined in the active section 2b to generate light. Part of the light emitted from the active section 2b is transmitted through the semiconductor section 2a and the light transmitting section 3 and injected into the wavelength conversion section 4. The light injected into the wavelength conversion section 4 is wavelength converted by phosphor and emitted outward from the wavelength conversion section 4. For instance, blue light emitted from the active section 2b is mixed with the (yellow, or red and green) light excited by the blue light into white light. The white light is emitted outward from the wavelength conversion section 4. In the embodiment, the optical path length inside the wavelength conversion section 4 is optimized in accordance with the emission characteristic of the light emitting section 2. That is, by providing a light transmitting section 3 having a prescribed shape, the wavelength conversion section 4 is formed to include a surface 4a such that the optical path length therein is adjusted to suppress chromaticity shift in accordance with the emission characteristic of the light emitting section 2. Thus, the chromaticity shift can be suppressed. For instance, the chromaticity shift can be reduced irrespective of the direction of viewing the semiconductor light emitting device 1 emitting white light. Thus, white light can be emitted in nearly the entire region of the wavelength conversion section 4.

Furthermore, the hardness of the cured resin portion of the wavelength conversion section 4 is set to exceed 10 in the Shore D hardness. Thus, it is possible to suppress detachment of phosphor from the wavelength conversion section 4 in singulating the semiconductor light emitting device 1.

Next, a method for manufacturing a semiconductor light emitting device according to the embodiment is illustrated.

Figure 6:
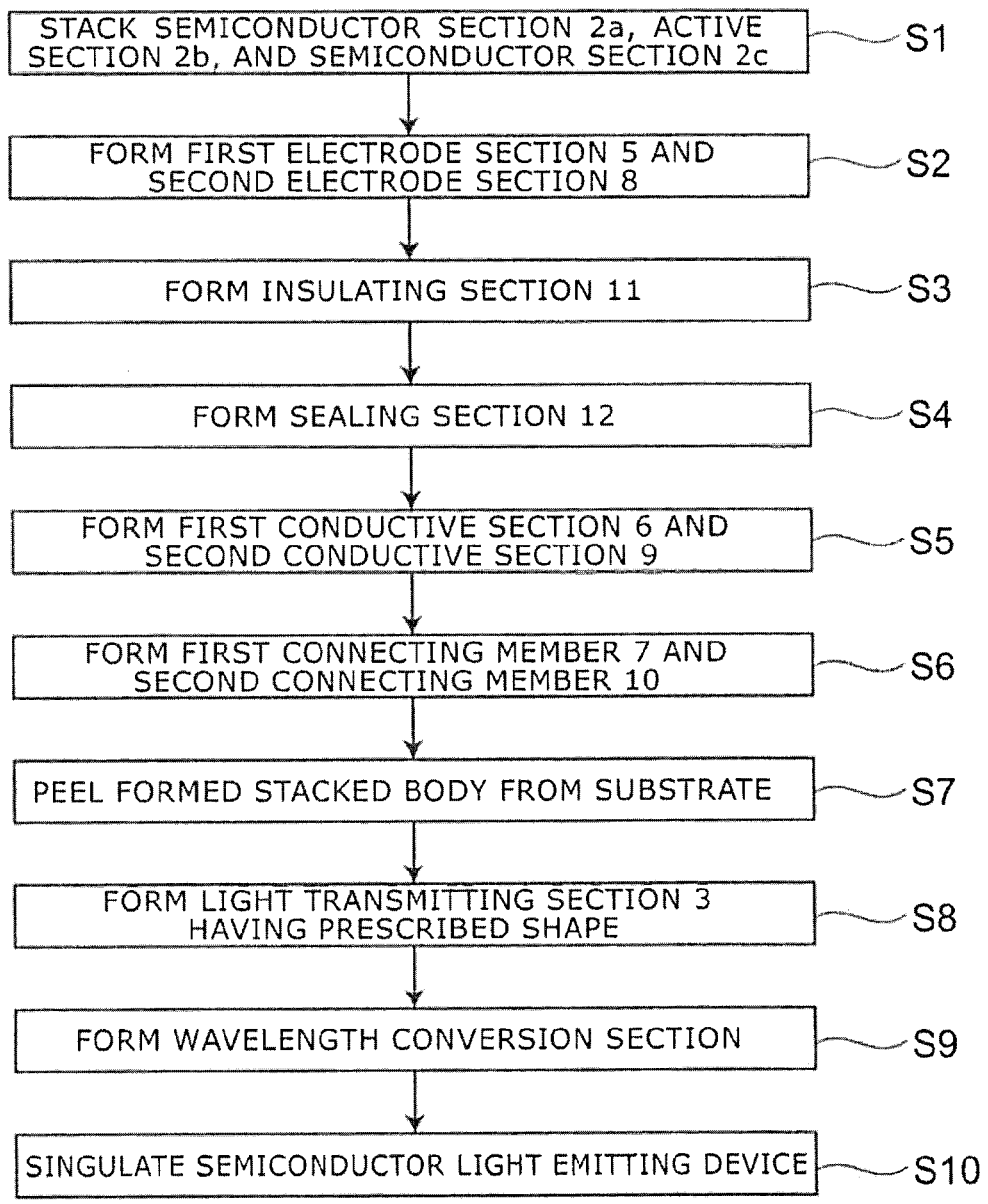
FIG. 6 is a flow chart for illustrating the method for manufacturing a semiconductor light emitting device according to the embodiment.

FIG. 6 is a flow chart for illustrating the method for manufacturing a semiconductor light emitting device according to the embodiment.

This method relates to the case of integrally forming a plurality of semiconductor light emitting devices and then singulating each semiconductor light emitting device.

First, on a substrate made of e.g. sapphire, a semiconductor section 2a, an active section 2b and a semiconductor section 2c having a prescribed shape are stacked in this order (step S1).

Here, these sections can be stacked by using e.g. a known vapor phase growth method. Examples of the vapor phase growth method can include the metal organic chemical vapor deposition (MOCVD) method, the hydride vapor phase epitaxy (HVPE) method, and the molecular beam epitaxy (MBE) method.

Next, a first electrode section 5 is formed on the semiconductor section 2a, and a second electrode section 8 is formed on the semiconductor section 2c (step S2).

Here, the first electrode section 5 and the second electrode section 8 can be formed by combining various physical vapor deposition (PVD) methods such as vacuum evaporation and sputtering, various chemical vapor deposition (CVD) methods, and plating methods with lithography and etching techniques.

Next, over the stacked body thus stacked on the substrate, an insulating section 11 having a prescribed shape is formed (step S3).

Here, the insulating section 11 can be formed by combining various physical vapor deposition (PVD) methods such as vacuum evaporation and sputtering and various chemical vapor deposition (CVD) methods with lithography and etching techniques.

Next, over the insulating section 11, a sealing section 12 having a prescribed shape is formed (step S4).

Here, the sealing section 12 can be formed by combining various physical vapor deposition (PVD) methods such as vacuum evaporation and sputtering and various chemical vapor deposition (CVD) methods with lithography and etching techniques.

Next, a first conductive section 6 and a second conductive section 9 are formed (step S5).

Here, the first conductive section 6 and the second conductive section 9 can be formed by combining various physical vapor deposition (PVD) methods such as vacuum evaporation and sputtering, various chemical vapor deposition (CVD) methods, and plating methods with lithography and etching techniques.

Next, a first connecting member 7 is formed on the end surface of the first conductive section 6, and a second connecting member 10 is formed on the end surface of the second conductive section 9 (step S6).

Here, the first connecting member 7 and the second connecting member 10 can be formed by combining various physical vapor deposition (PVD) methods such as vacuum evaporation and sputtering, various chemical vapor deposition (CVD) methods, and plating methods with lithography and etching techniques.

Next, the stacked body thus formed is peeled from the substrate (step S7).

Here, the stacked body can be peeled from the substrate by e.g. the laser lift-off method.

Next, the peeled stacked body is reversed, and a light transmitting section 3 having a prescribed shape is formed on the semiconductor section 2a (step S8).

Here, a resin, for instance, can be applied and shaped to form the light transmitting section 3.

For instance, the light transmitting section 3 can be formed by the nanoimprint method or the molding method.

Here, in the case of using the UV nanoimprint method, the resin is irradiated with ultraviolet radiation while a shaping die is pressed to the resin. Thus, the shaped resin is cured to form the light transmitting section 3. In the case of using the UV nanoimprint method, the shaping die is formed from an ultraviolet transmissive material, and the resin is made of an ultraviolet curable resin.

In the case of using the molding method, heating is performed while a shaping die is pressed to the resin. Thus, the shaped resin is cured to form the light transmitting section 3. In the case of using the molding method, the shaping die is provided with a heater, and the resin is made of a thermosetting resin.

Here, a light transmitting section having various shapes can be formed by changing the shape of the shaping surface of the shaping die.

The method for forming the light transmitting section is not limited to the nanoimprint method and the molding method, but can be appropriately modified.

For instance, the light transmitting section may be formed by stacking resin layers in a prescribed shape using a microdroplet application method such as the ink jet method and the dispense method.

Next, over the light transmitting section 3, a wavelength conversion section 4 is formed (step S9).

For instance, a resin mixed with prescribed phosphor can be applied over the light transmitting section 3, shaped in a plate-like configuration, and cured to form the wavelength conversion section 4. Here, the hardness of the cured resin portion of the wavelength conversion section is set to exceed 10 in the Shore D hardness.

For instance, as described above, the hardness after curing is set to exceed 10 in the Shore D hardness by appropriately adding an additive such as curing agent.

Application and shaping of the resin mixed with phosphor can be based on the printing and application method such as the squeegee method, screen method, and spin method.

Here, because the light transmitting section having a prescribed shape is provided, the optical path length inside the wavelength conversion section can be optimized in accordance with the emission characteristic of the light emitting section.

That is, in the process of forming the wavelength conversion section, the wavelength conversion section is formed to include a shape such that the optical path length therein is adjusted to suppress chromaticity shift in accordance with the emission characteristic of the light emitting section.

Thus, the chromaticity shift can be suppressed.

Next, a plurality of integrally formed semiconductor light emitting devices are singulated (step S10).

Here, the semiconductor light emitting device can be singulated by e.g. the blade dicing method.

In this case, the wavelength conversion section is cut.

However, the hardness of the cured resin portion of the wavelength conversion section is set to exceed 10 in the Shore D hardness. Hence, detachment of phosphor from the wavelength conversion section in singulating the semiconductor light emitting device can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, the device including:
   a light emitting section including a first major surface, a second major surface opposite from the first major surface, and a first electrode section and a second electrode section formed on the second major surface;
   a light transmitting section provided on a side of the first major surface; and
   a wavelength conversion section provided on a side of the first major surface and formed from a resin mixed with a phosphor,
   the method comprising:
      integrally forming the semiconductor light emitting device in a plurality; and
      singulating the plurality of integrally formed semiconductor light emitting devices,
   wherein integrally forming comprises:
      forming the light emitting section on a substrate;
      peeling the light emitting section from the substrate;
      forming the light transmitting section on the peeled light emitting section; and
      forming the wavelength conversion section provided over the light transmitting section, and including a cutting line for singulating,
      in forming the light transmitting section, the shape of the light transmitting section is changed such that an optical path length in the wavelength conversion section is adjusted to suppress chromaticity shift in accordance with an emission characteristic of the light emitting section,
      in forming the wavelength conversion section, a thickness of the wavelength conversion section is changed such that the optical path length in the wavelength conversion section is adjusted to suppress chromaticity shift by the light transmitting section, and
      in forming the wavelength conversion section, setting a hardness of the resin to exceed 30 in Shore D hardness such that the phosphor included in the wavelength conversion section is inhibited from desorption from the resin.

2. The method according to claim 1, further comprising:
   in the singulating, the wavelength conversion section being cut using a blade dicing method.

3. The method according to claim 1, wherein the hardness of the resin is controlled by adding an additive for increasing cross-linking sites of the resin.

4. The method according to claim 1, wherein the resin is at least one selected from the group consisting of epoxy resin, silicone resin, methacrylic resin (PMMA), polycarbonate (PC), cyclic polyolefin (COP), alicyclic acrylate (OZ), allyldiglycol carbonate (ADC), acrylic resin, fluororesin, a hybrid resin of silicone resin and epoxy resin, and urethane resin.

5. The method according to claim 1, wherein the resin is at least one selected from the group consisting of methylphenyl silicone, dimethyl silicone, and a hybrid resin of methylphenyl silicone and epoxy resin.

6. The method according to claim 1, wherein the phosphor has an emission wavelength of 380 nm or more and 720 nm or less, and includes at least one element selected from the group consisting of silicon (Si), aluminum (Al), titanium (Ti), germanium (Ge), phosphorus (P), boron (B), yttrium (Y), alkaline earth element, sulfide element, rare earth element, and nitride element.

7. The method according to claim 1, wherein in forming the wavelength conversion section, a convex shape having a curvature radius of 250 nm or more is formed in the wavelength conversion section.

8. The method according to claim 1, wherein in forming the wavelength conversion section, a concave shape having a curvature radius of 200 nm or more is formed in the wavelength conversion section.

* * * * *